(12) United States Patent
Matsuyama et al.

(10) Patent No.: US 8,183,165 B2
(45) Date of Patent: May 22, 2012

(54) PLASMA PROCESSING METHOD

(75) Inventors: Seiji Matsuyama, Kyoto (JP); Toshio Nakanishi, Amagasaki (JP); Shigenori Ozaki, Amagasaki (JP); Hikaru Adachi, Amagasaki (JP); Koichi Takatsuki, Nirasaki (JP); Yoshihiro Sato, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/019,093

(22) Filed: Feb. 1, 2011

(65) Prior Publication Data

US 2011/0124202 A1 May 26, 2011

Related U.S. Application Data

(60) Division of application No. 12/757,802, filed on Apr. 9, 2010, now Pat. No. 7,897,518, which is a division of application No. 11/514,236, filed on Sep. 1, 2006, now Pat. No. 7,723,241, which is a continuation-in-part of application No. PCT/JP2005/003488, filed on Mar. 2, 2005.

(30) Foreign Application Priority Data

Mar. 3, 2004 (JP) ................ 2004-058945
Sep. 15, 2004 (JP) ................ 2004-268236

(51) Int. Cl.
*H01L 21/318* (2006.01)
(52) U.S. Cl. ............ 438/776; 438/775; 257/E21.292; 257/E21.268
(58) Field of Classification Search ........... 438/775, 438/776
See application file for complete search history.

(56) References Cited

U.S. PATENT DOCUMENTS

| 6,143,081 | A | 11/2000 | Shinriki et al. | |
| 6,399,520 | B1 | 6/2002 | Kawakami et al. | |
| 7,163,877 | B2 * | 1/2007 | Niimi et al. | 438/513 |
| 7,179,754 | B2 | 2/2007 | Kraus et al. | |
| 7,674,722 | B2 * | 3/2010 | Nishita et al. | 438/770 |
| 7,723,241 | B2 | 5/2010 | Matsuyama et al. | 438/776 |
| 2003/0232491 | A1 | 12/2003 | Yamaguchi | |
| 2006/0040483 | A1 * | 2/2006 | Niimi et al. | 438/591 |
| 2007/0049048 | A1 * | 3/2007 | Rauf et al. | 438/775 |

FOREIGN PATENT DOCUMENTS

| JP | 2002-208593 | 7/2002 |
| JP | 2002-222941 | 8/2002 |
| JP | 2003-77915 | 3/2003 |
| JP | 2004-22902 | 1/2004 |
| KR | 1998-0011767 | 4/1998 |
| WO | WO 2005/086215 A1 | 9/2005 |

* cited by examiner

*Primary Examiner* — Alexander Ghyka
(74) *Attorney, Agent, or Firm* — Oblon, Spivak, McClelland, Maier & Neustadt, L.L.P.

(57) ABSTRACT

According to the present invention, when a nitridation process by plasma generated by a microwave is applied to a substrate with an oxide film having been formed thereon to from an oxynitride film, the microwave is intermittently supplied. By the intermittent supply of the microwave, ion bombardment is reduced in accordance with a decrease in electron temperature, and a diffusion velocity of nitride species in the oxide film lowers, which as a result makes it possible to prevent nitrogen from concentrating in a substrate-side interface of an oxynitride film to increase the nitrogen concentration therein. Consequently, it is possible to improve quality of the oxynitride film, resulting in a reduced leadage current, an improved operating speed, and improved NBTI resistance.

9 Claims, 6 Drawing Sheets

PLASMA PROCESSING METHOD

CROSS-REFERENCE TO RELATED APPLICATION

This is a divisional of application Ser. No. 12/757,802, filed Apr. 9, 2010, which is a divisional of application Ser. No. 11/514,236, filed Sep. 1, 2006, which is a continuation in part of PCT Application No. PCT/JP2005/003488, filed on Mar. 2, 2005, which claims the benefit of Japanese Patent Applications No. 2004-058945, filed on Mar. 3, 2004, and No. 2004-268236, filed on Sep. 15, 2004, all of which are incorporated herein by reference.

BACKGROUND OF THE INVENTION

1. Field of the Invention

The present invention relates to a plasma processing method and a computer storage medium.

2. Description of the Related Art

In a recent semiconductor device, a thickness reduction of a gate insulation film is required to improve an operating speed. However, for example, a conventional silicon oxide film has a problem that a thickness reduction results in an increased leakage current and boron contained in an electrode material penetrates the insulation film, which is not desirable. Therefore, adopting an oxynitride film that is thin yet has a prescribed insulative property and can reduce the diffusion of boron has been considered.

For forming an oxynitride film, there has been proposed a method in which an oxide film, after being formed, is plasma-nitrided by a plasma processing apparatus utilizing a microwave, thereby forming the oxynitride film (Japanese Patent Application Laid-open No. 2002-208593). In such a case, the microwave is continuously supplied to generate plasma.

Such a method of forming the oxynitride film by the plasma nitridation process can achieve the same level of a flat band voltage as that of a thermal oxide film since nitrogen distribution can be made higher on an electrode (surface) side, and because of the above reason, can utilize an advantage of plasma that, for example, the diffusion of impurities is easily stopped on the surface side.

Since a plasma nitridation process causes damage due to plasma used therein, an annealing process is performed thereafter. A conventionally adopted annealing process of this type is a so-called "strong annealing process" in which a substrate is heated at about 1100° C. to 1200° for 31 seconds to 60 seconds in a substantially atmospheric-pressure atmosphere. However, during such a strong annealing process, oxygen diffuses due to the annealing process to increase film thickness and thus a dielectric constant lowers, which may possibly result in a lower operating speed and may possibly deteriorate a characteristic against NBTI (Negative Bias Temperature Instability: a phenomenon that deterioration in a source-drain ON current or shifting of a threshold value in a negative direction occurs with time when a negative voltage and continuous temperature stress of about 100° C. are given to a gate of a PMOSFET (instability under negative voltage/high-temperature stress)) which is distinguished especially in a PMOSFET. Therefore, there is a demand for an art utilizing an advantage of microwave plasma with low electron temperature and eliminating a need for a strong annealing process after such a plasma nitridation process.

Further, it has been conventionally difficult to improve both a static characteristic (gate leakage current, source-drain ON current) and NBTI resistance of a transistor in which nitrogen is introduced in a gate oxide film.

SUMMARY OF THE INVENTION

The present invention was made in view of the above and an object thereof is to realize the following when a substrate with an oxide film having been formed thereon is subjected to a nitridation process by plasma generated by a microwave: that is, reducing damage at the time of the nitridation to eliminate a need for a subsequent annealing process or allowing the annealing process, even if performed, to be a weak annealing process, leading to improved quality of an oxynitride film, thereby achieving a reduced leakage current, an improved operating speed, improved NBTI resistance, and an improved static characteristic in a semiconductor device.

To attain the above object, a plasma processing method of the present invention is a method in which a nitridation process by plasma generated by a microwave is applied to a substrate with an oxide film having been formed thereon, the method characterized in that the plasma nitridation process is performed by intermittently supplying the microwave. The plasma nitridation process is performed by supplying the microwave in, for example, pulse form.

According to the findings of the inventors, it is thought that in the case of the intermittent supply of the microwave for a plasma nitridation process, electron temperature of plasma decreases in an OFF time of the supply of the microwave, and ion bombardment to a surface of the oxide film is reduced, so that a diffusion velocity of nitrogen active species in the oxide film is lowered, compared with the conventional case of the continuous supply of the microwave for the plasma nitridation process. As a result, it is possible to prevent nitrogen from diffusing in an interface between, for example, a silicon substrate and an oxynitride insulation film to make the concentration of nitrogen in the interface higher. As a result, it is possible to reduce a leakage current and form a higher-quality oxynitride film with an improved NBTI characteristic, without increasing the film thickness (equivalent oxide thickness: EOT). The inventors have verified that NBTI resistance that is two to ten times as high as conventional NBTI resistance is achieved.

The inventors have further found that by changing at least a cycle of repetition of the supply and stop of the microwave or a ratio of an ON time and an OFF time of the supply of the microwave (duty ratio) in the intermittent supply, it is possible to improve in a MOSFET both an ON current characteristic and NBTI resistance which have been in a trade-off relation even if nitrogen concentration in a conventional film is changed. Therefore, when the microwave is supplied intermittently as described above, by changing at least the repetition cycle or the ratio of the ON time and the OFF time of the supply of the microwave, it is possible to improve both the ON current characteristic and the NBTI resistance, whereby it is possible to improve film quality of an insulation film.

The ON time of the supply of the microwave in the intermittent supply is preferably 5 μsec to 100 μsec, more preferably 5 μsec to 50 μsec. The OFF time of the supply of the microwave is preferably 5 μsec to 100 μsec, more preferably 5 μsec to 50 μsec. The cycle of the repetition of the supply and stop of the microwave in the intermittent supply is preferably 5 kHz to 100 kHz, more preferably 10 kHz to 50 kHz. The ratio of the ON time and the OFF time of the supply of the microwave in the intermittent supply is preferably about 0.10 to 5:1, that is, the ON duty ratio in terms of a pulse waveform is preferably about 9% to 90%, more preferably 30% to 83%, still more preferably 50%. The intermittent supply may rely on ON-OFF of the supply of the microwave or the microwave may be modulated by a supplied pulse wave.

Nitrogen concentration in the oxide film that has undergone the nitridation process is preferably 5 at % to 15 at %, more preferably 9 at % to 13 at %. Controlling the concentration within this range makes it possible to improve a leakage current, an ON current, and NBTI resistance. Further, a pressure in a process vessel during the nitridation process is preferably about 1 mTorr to 10 T (0.133 Pa to 1330 Pa). More preferably, the pressure is 10 mTorr to 1 T (1.33 Pa to 133.3 Pa).

For carrying out such plasma processing of the present invention, a plasma processing apparatus having the following structure is preferably used. That is, the plasma processing apparatus includes: a mounting table provided in a process vessel to mount a substrate thereon; a dielectric that is disposed in an upper area of the process vessel and through which the microwave is introduced into a process space to generate the plasma; a gas supply part supplying a process gas to an upper area in the process vessel; and a dielectric plate that is disposed at a position lower than a gas supply port of the gas supply part and higher than the substrate placed on the mounting table, has a large number of through holes, and covers at least the substrate, and by using the plasma processing apparatus when the plasma nitridation process is performed, high-energy ions are intercepted by the dielectric plate having a large number of the through holes, so that it is possible to alleviate damage to a nitride film and reduce plasma damage accompanying the plasma nitridation process. Consequently, an annealing process that is thereafter performed for damage recovery can be a weak annealing process that anneals the substrate in a shorter time, and accordingly an increase in film thickness during the annealing process is reduced.

As described above, after the plasma nitridation process, the annealing process is sometimes necessary, and in the present invention, more preferably, the annealing process is applied to a substrate in a pressure-reduced atmosphere. For example, the annealing process is preferably carried out in a pressure-reduced vessel at a reduced pressure of 20 Pa to 100000 Pa. Further, the annealing process may be "the weak annealing" which is carried out by heating the substrate to a temperature of 900° C. to 1200° C. for one second to thirty seconds.

According to the present invention, when a substrate with an oxide film having been formed thereon is subjected to a nitridation process by plasma generated by a microwave, damage at the time of the plasma nitridation is reduced and a need for a subsequent annealing process is eliminated, or the annealing process, even if performed, may be a weak annealing process. Consequently, it is possible to improve quality of an oxynitride film to realize a reduced leakage current, an improved operating speed, and improved NBTI resistance of a manufactured semiconductor device.

DETAILED DESCRIPTION OF THE PREFERRED EMBODIMENT

Figure 1:
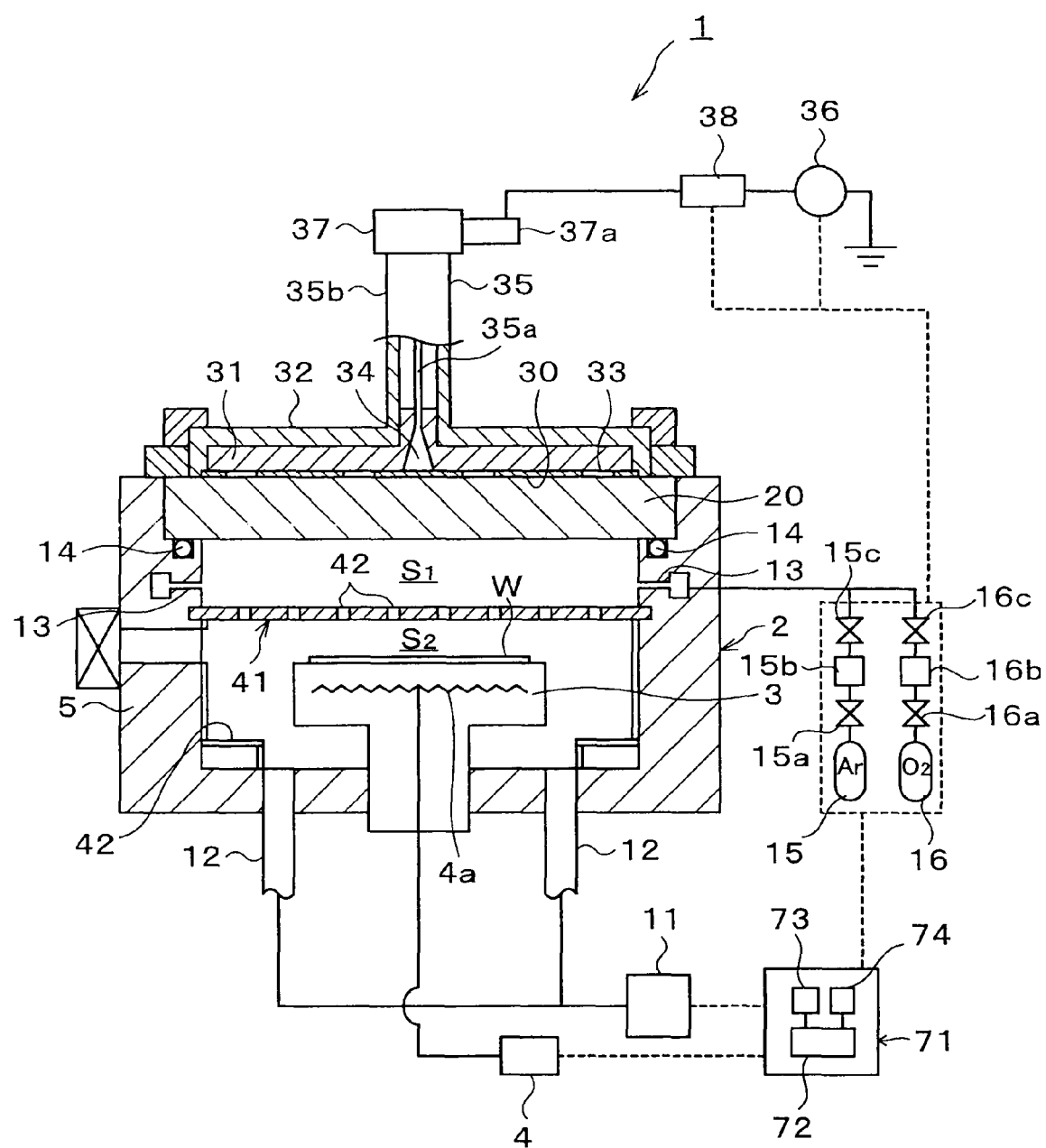
FIG. 1 is a vertical cross-sectional view of a plasma processing apparatus for carrying out a plasma processing method according to an embodiment.

Hereinafter, an embodiment of the present invention will be described. FIG. 1 shows a state of a vertical cross section of a plasma processing apparatus 1 for carrying out a plasma processing method according to this embodiment, and this plasma processing apparatus 1 includes a process vessel 2 made of, for example, aluminum and having a bottomed cylindrical shape with an upper part being open. The process vessel 2 is grounded. On a bottom of the process vessel 2, provided is a susceptor 3 as a mounting table on which a substrate, for example, a semiconductor wafer (hereinafter, referred to as a wafer) W is mounted. The susceptor 3 is made of a ceramic member of, for example, aluminum nitride, and has therein a heater 4a that generates heat when supplied with power from an external power source 4. This enables heating of the wafer W on the susceptor 3 to a predetermined temperature.

In the bottom of the process vessel 2, provided are exhaust pipes 12 through which an atmosphere in the process vessel 2 is exhausted by an exhaust apparatus 11 such as a vacuum pump. Further, in a sidewall of the process vessel 2, provided are gas introducing parts 13 through which process gasses are supplied from process gas supply sources. As the gas introducing parts 13, gas nozzles are usable, for example. In this embodiment, as the process gas supply sources, an argon gas supply source 15 and a nitrogen gas supply source 16 are provided and they are connected to the gas introducing parts 13 via respective valves 15a, 16a, massflow controllers 15b, 16b, and valves 15c, 16c.

A transmissive window 20 made of, for example, a dielectric quartz member is provided in the upper opening of the process vessel 2 via a sealing member 14 such as an O-ring for ensuring airtightness. Instead of the quartz member, other dielectric material, for example, ceramics such as $Al_2O_3$ or AlN may be used. By this transmissive window 20, a process space S is formed in the process vessel 2. The transmissive window 20 has a circular plane section.

Above the transmissive window 20, a plane antenna member, for example, a disk-shaped radial line slot antenna 30, is provided, and on an upper surface of the radial line slot antenna 30, a retardation plate 31 is disposed. The retardation plate 31 is made of a material whose dielectric constant in vacuum is higher than 1, for example, quartz or resin. A conductive cover 32 is further provided to cover the retardation plate 31. A cooling part is provided in the cover 32 to cool the cover 32, the transmissive window 20, and the antenna 30. The radial line slot antenna 30 is formed of a thin disk made of a conductive material, for example, copper plated or coated with Ag, Au, or the like, and has a large number of slots 33 arranged, for example, spirally or coaxially.

A coaxial waveguide 35 is connected to the cover 32, and the coaxial waveguide 35 is composed of an inner conductor 35a and an outer tube 35b. The inner conductor 35a is connected to the radial line slot antenna 30. A radial line slot antenna 30 side of the inner conductor 35a, that is, a lower part thereof has a conical shape so that a microwave propagates to the radial line slot antenna 30 efficiently. The coaxial waveguide 35 guides a microwave of, for example, 2.45 GHz generated in a microwave supplier 36 so that the microwave propagates uniformly to the radial slot antenna 30 via a rectangular waveguide 37a, a mode converter 37, the coaxial waveguide 35, and the retardation plate 31 and is introduced into the process vessel 2 via the transmissive window 20. Then, by energy of the microwave, an electromagnetic field is formed on a bottom face of the transmissive window 20, and the process gases supplied into the process vessel 2 through the gas introducing parts 13 are turned into plasma, whereby plasma processing is applied to the wafer W on the susceptor 3. A pulse oscillator 38 for ON-OFF of the supply of the microwave is attached to the microwave supplier 36, and by the operation of the pulse oscillator 38, the microwave is pulse-modulated, so that the microwave can be intermittently supplied.

A shower plate 41 is horizontally disposed at a position higher than the sidewall 5 of the process vessel 2 and lower than the gas introducing parts 13. The shower plate 41 is made of a dielectric, for example, a quartz material and has a large number of through holes 42 arranged uniformly in its surface. By the shower plate 41, the process space in the process vessel 2 is divided into an upper process space S1 and a lower process space S2. By the shower plate 41, it is possible to trap ions generated in the upper process space S1 and allow only radicals to pass therethrough. This can reduce ion damage.

A quartz liner 42 is provided on an inner wall surface, which is positioned lower than the gas introducing parts 13, of the process vessel 2, so that the generation of metal contamination from the inner wall surface of the process vessel 2 due to sputtering is prevented when plasma is generated in the process vessel 2.

The plasma processing apparatus 1 as configured above is controlled by a controller 71. The controller 71 has a central processing unit 72, a support circuit 73, and a storage medium 74 containing related control software. The controller 71 controls, for example, the supply, stop, flow rate adjustment of the gasses from the gas introducing parts 13, temperature adjustment of the heater 14a, the exhaust by the exhaust apparatus 11, the microwave supplier 36, the pulse oscillator 38, and so on, thereby performing necessary control in processes in which the plasma processing is carried out in the plasma processing apparatus 1.

As the central processing unit 72 of the controller 71, a processor for general-purpose computer is usable. As the storage medium 74, usable are various types of storage media such as, for example, a RAM, a ROM, a flexible disk, and a hard disk. The support circuit 73 is connected to the central processing unit 72 in order to support the processor in various ways.

The plasma processing apparatus 1 has the above-described configuration, and when a plasma nitridation process is applied to a wafer W on whose surface a silicon oxide film has been formed by, for example, a thermal oxidation process or a plasma oxidation process, the wafer W is placed on the susceptor 3 in the process vessel 2, and while a predetermined process gas, for example, a mixed gas of $Ar/N_2$, is supplied into the process vessel 2 from the gas introducing parts 13 at a flow rate of, for example, 1000/40 sccm, the atmosphere in the process vessel 2 is exhausted through the exhaust pipes 12, whereby the inside of the process space S is set to a predetermined pressure, for example, 1.3 Pa to 133.3 Pa, preferably 6.7 Pa to 126.6 Pa. Here, the pressure is set to 6.7 Pa. Then, a high-frequency microwave is generated by the microwave supplier 36 and intermittently supplied by the modulation of the pulse oscillator 38 to propagate uniformly to the radial line slot antenna 30 via the coaxial waveguide 35 and the retardation plate 31. At this time, average power of the microwave is 800 W, and an ON time and an OFF time in the repetition cycle is 50 μsec and 50 μsec respectively. Consequently, an electromagnetic wave is intermittently supplied though the slots 33 of the radial line slot antenna 30 and through the transmissive window 20, so that the microwave is introduced into the process vessel 2.

Consequently, an electric field is formed on the bottom surface of the transmissive window 20, and the process gas is turned into plasma in the upper process space S1, so that nitrogen radicals are generated. Then, the nitrogen radicals pass through the through holes 42 of the shower plate 41 to be uniformly supplied to a surface of the wafer W, so that the nitridation process is applied to the oxide film. At this time, plasma density is $1 \times 10^{10}$ to $5 \times 10^{12}/cm^3$, the high-energy ions are intercepted by the shower plate 41, and electron temperature of the plasma is controlled low, namely, 0.1 eV to 1 eV, more preferably 0.1 eV to 0.65 eV, and thus high plasma density and low ion energy are achieved, which enables plasma processing that causes only a small damage.

Since the microwave is intermittently supplied at this time, average nitrogen ion irradiation energy is lowered, surface temperature of the wafer W during the supply OFF time decreases, and the diffusion velocity of nitride species in the oxide film is lowered, which enables a plasma nitridation process causing only a small damage. Moreover, in the plasma processing apparatus 1, since the plasma nitridation process is applied via the shower plate 41, direct irradiation of the high-energy ions is intercepted by the shower plate 41, and from this point of view, a plasma nitridation process causing only a small damage is applied to the oxide film of the wafer W.

The ON time in the intermittent microwave supply is preferably 5 μsec to 100 μsec per cycle. The cycle of repetition of the supply and stop of the microwave is preferably 5 kH to 100 kHz. A ratio of the ON time and the OFF time of the supply of the microwave in the intermittent supply is preferably 0.10 to 5:1, that is, an ON duty ratio when the supplied microwave is regarded as a pulsed waveform is preferably 9% to 90%, more preferably 30% to 83%, still more preferably 50%.

Figure 2:
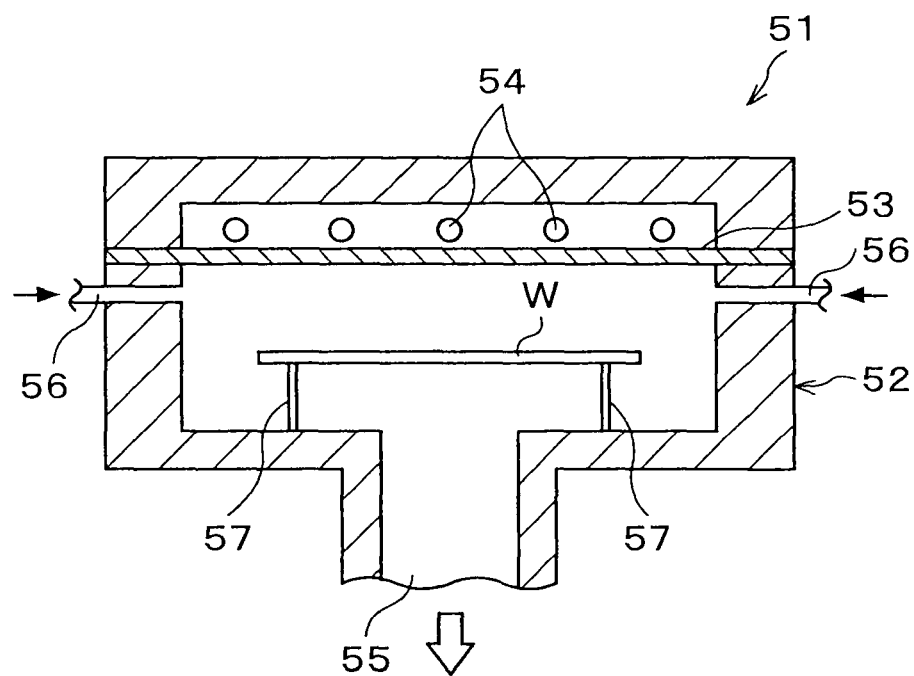
FIG. 2 is a vertical cross-sectional view of an annealing apparatus for carrying out an annealing process.

The wafer W thus having undergone the plasma nitridation process may be subsequently subjected to an annealing process. For the annealing process, various annealing apparatuses are usable, and for example, a lamp annealing apparatus 51 shown in FIG. 2 is usable.

The annealing apparatus 51 is structured such that a transparent quartz plate 53 is horizontally provided in an upper area inside a process vessel 52 and for example, lamps 54 as heat sources are disposed in a space between a cover part and the quartz plate 53. On a bottom of the process vessel 52, an exhaust port 55 communicating with a vacuum exhaust means (not shown) is formed. Gas supply ports 56 are provided under the quartz plate 53 in the sidewall of the process vessel 52. The wafer W is placed on support pins 57 disposed on the bottom of the process vessel 52.

In the annealing apparatus 51 as described above, the annealing process is applied to the wafer W having undergone the plasma nitridation process. The process is carried out under the conditions that, for example, a mixed gas of $N_2/O_2$ is supplied from the gas supply ports 56, a pressure inside the process vessel 2 is reduced to, for example, about 133 Pa (1 Ton), and the wafer W is heated to about 1000° C. Another example of the process gas is a gas containing at least oxygen and, in order to lower an oxygen partial pressure, the gas diluted with a nitrogen gas is preferably used. Further, the gas to which ammonia or hydrogen is added may be used. Under such heating conditions, the wafer W is subjected to a weak annealing process for about 1 second to 30 seconds, for instance, more preferably 5 seconds to 10 seconds. Compared with a conventional annealing process after a nitridation process, such a short annealing process in the pressure-reduced atmosphere is preferable. Consequently, it is possible to further improve film quality, that is, NBTI resistance and an ON current characteristic, of an oxynitride film without any great increase in thickness of the oxynitride film, and to recover damage in the oxynitride film and the interface after the plasma processing.

Figure 3:
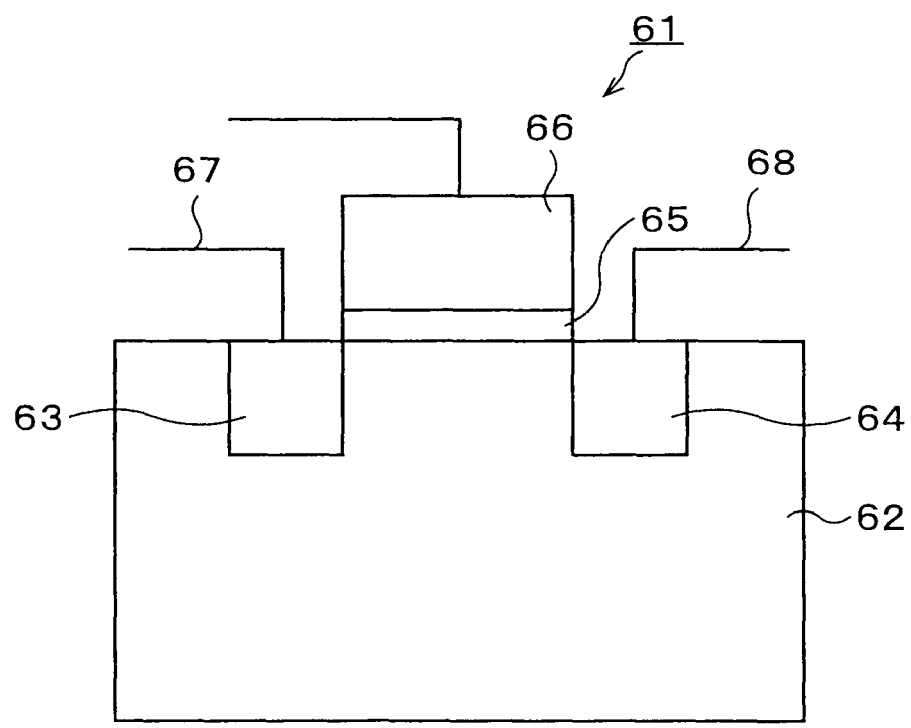
FIG. 3 is an explanatory view of a P-MOSFET in which an oxynitride film formed in this embodiment is adopted as a gate insulation film.

A description will be given on an effect when, for example, a gate insulation film of a P-MOSFET is formed by the plasma processing method according to the embodiment described above. FIG. 3 schematically shows the structure of a P-MOSFET 61, in which P-type semiconductors 63, 64 are formed on an N-type semiconductor substrate 62, and a drain electrode 67 and a source electrode 68 are led out. A gate insulation film 65 is formed therebetween, a gate electrode 66 is formed thereon, and a gate lead-out electrode 69 is further formed. The oxynitride film formed by the plasma nitridation process described above is adopted as the gate insulation film 65. Note that an N-MOSFET can be structured by replacing the N-type semiconductor substrate 62 and the P-type semiconductors 63, 64 by each other.

In a case where the oxynitride film formed by the plasma nitridation of this embodiment is adopted as the gate insulation film 65, nitrogen concentration on the side of an interface with the N-type semiconductor substrate 62 in the gate insulation film 65 is controlled to be lower than that in an oxynitride film formed by a conventional plasma nitridation process, and as a result, NBTI resistance is improved. Next, this will be described in more detail along with other characteristics.

Figure 4:
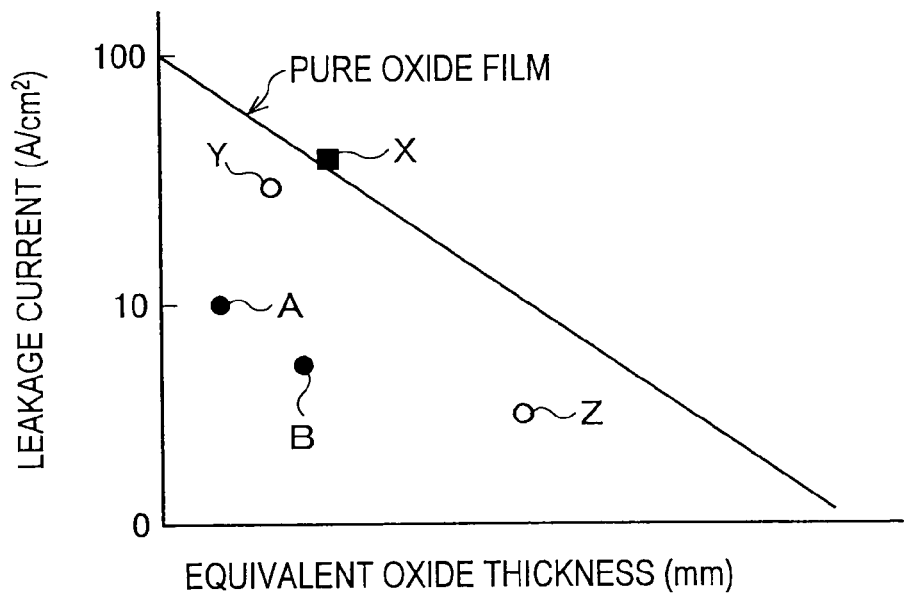
FIG. 4 is an explanatory chart showing characteristics of an equivalent oxide thickness and a leakage current.

FIG. 4 shows the correlation between an equivalent oxide thickness and a leakage current, when "the conventional plasma nitridation process" (Y) is applied to an oxide film (X), and "the conventional plasma nitridation process+the conventional annealing process" (Z) is applied to the oxide film (X), and when the processes according to this embodiment, namely, "the plasma nitridation process by the intermittent microwave supply" (A) and "the plasma nitridation process by the intermittent microwave supply+the annealing process of the present invention (weak annealing)" (B) are applied to the oxide film (X).

As is seen in FIG. 4, a leakage current in a gate insulation film is lower and film thickness is thinner in an N-MOSFET subjected to "the plasma nitridation process by the intermittent microwave supply" (A) according to the embodiment than in an N-MOSFET subjected to "the conventional plasma nitridation process" (Y). As for a case where the annealing process is further applied, when "the conventional nitridation process+the conventional annealing process" (Z) is applied, though the leakage current is reduced, the film thickness is greatly increased, which deteriorates a high-speed operability. On the other hand, when "the plasma nitridation process by the intermittent microwave supply+the annealing process of the present invention (weak annealing)" (B) is applied, though a value of the leakage current itself is slightly larger than in the conventional process, only a small increase in the film thickness is observed, which means that high-speed operability is ensured.

Figure 5:
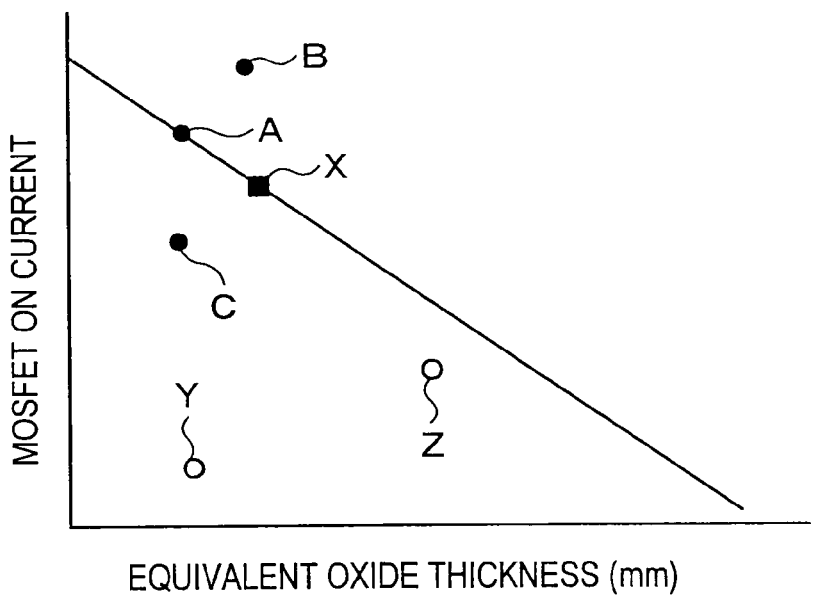
FIG. 5 is an explanatory chart showing characteristics of an equivalent oxide thickness and a source-drain ON current of a MOSFET.

Next, as a result of studying an equivalent oxide thickness and a source-drain ON current of an N-MOSFET, it is seen as shown in FIG. 5 that a higher ON-current value is obtained in this embodiment than in the conventional art, both in the case of "the plasma nitridation process by the intermittent microwave supply" (A) and in the case of "the plasma nitridation process by the intermittent microwave supply+the annealing process of the present invention (weak annealing)" (B).

Figure 6:
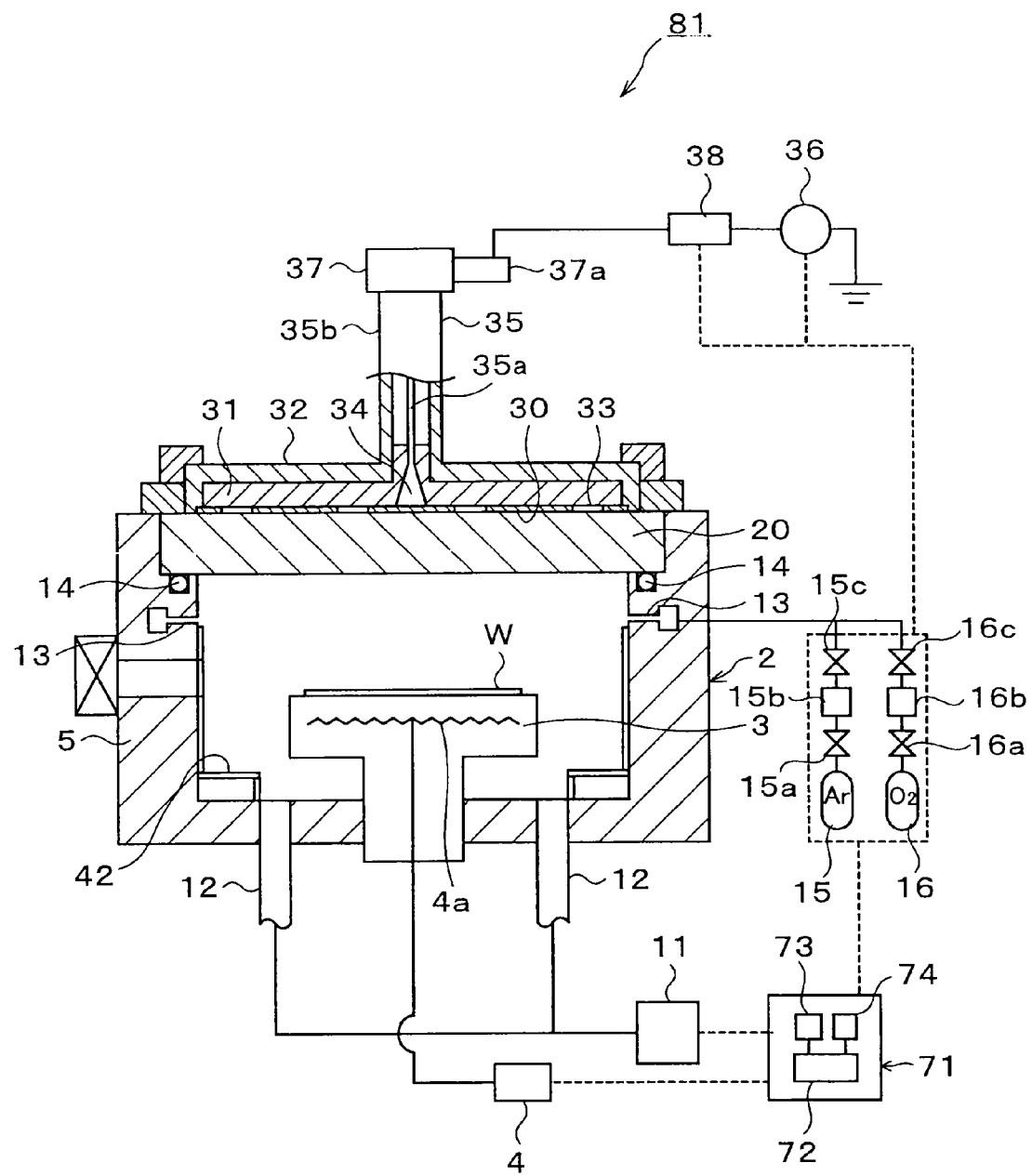
FIG. 6 is a vertical cross-sectional view of a plasma processing apparatus not including a shower plate.

In FIG. 5, (C) represents the result when a similar plasma nitridation process by the intermittent supply of a microwave is performed by using a plasma processing apparatus 81 shown in FIG. 6 not having the shower plate 41 of the plasma processing apparatus 1. That is, the plasma processing apparatus 81 in FIG. 6 is configured such that the shower plate 41 of the plasma processing apparatus 1 shown in FIG. 1 is removed, and the other configuration is the same as that of the plasma processing apparatus 1 in FIG. 1.

It has been found from the result shown in FIG. 5 that, in the plasma nitridation process, a higher ON current value is obtained in the MOSFET subjected to the plasma nitridation process by the plasma processing apparatus 1 having the shower plate 41 shown in FIG. 1. A possible reason for this is that an effect of reducing an incident ion amount owing to the shower plate 41 works synergistically with an effect of further lowering incident ion energy owing to an electron temperature decrease due to the intermittent microwave supply, thereby producing the more favorable result.

Figure 7:
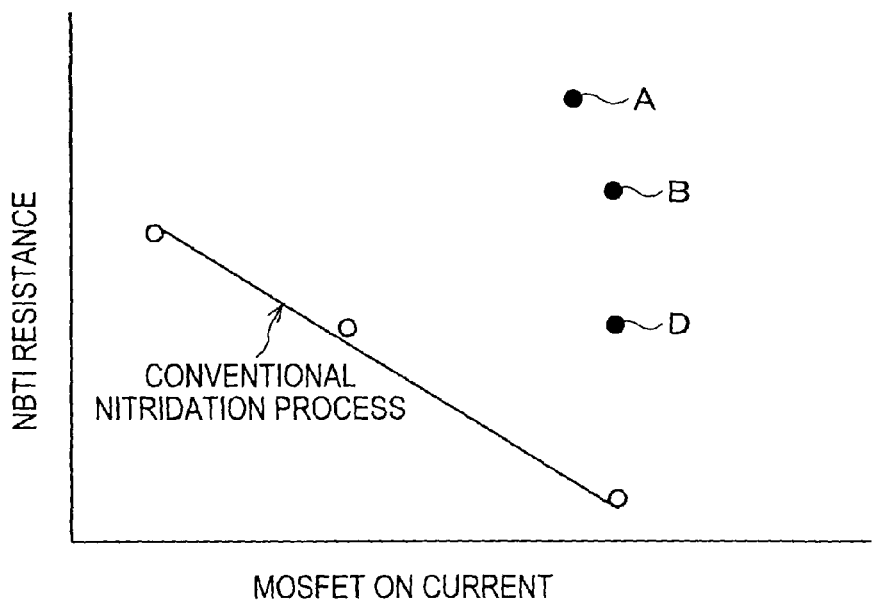
FIG. 7 is an explanatory chart showing characteristics of an ON current and NBTI resistance of a P-MOSFET.

Next, an ON current and resistance against NBTI (an index thereof is reliability when a negative-voltage/high-temperature stress is applied: for example, a shift amount of a threshold voltage, life until an ON current value exceeds a tolerable range, or a shift amount and a deterioration degree thereof) of an N-MOSFET were studied. As shown in FIG. 7, far higher NBTI resistance is obtained in the plasma nitridation process according to the embodiment of the present invention. Further, (D) represents a result when, as the aforesaid annealing after the plasma nitridation process, "the conventional strong annealing" of this type is performed instead of "the weak annealing process", and higher NBTI resistance is still observed in the plasma nitridation process according to the present invention, even if followed by the conventional "strong annealing process", than in the conventional process.

Figure 8:
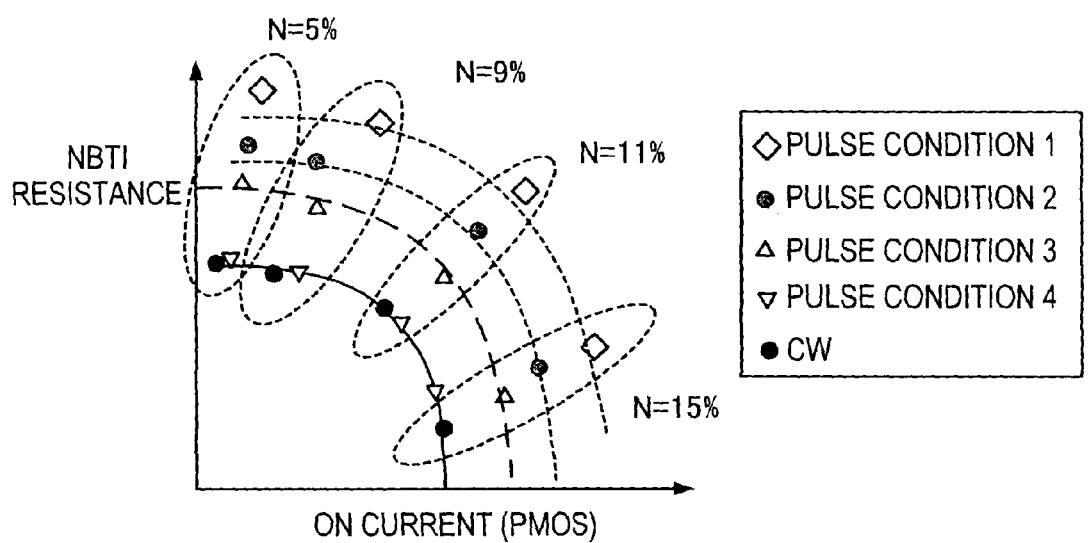
FIG. 8 is an explanatory chart showing characteristics of an ON current and NBTI resistance of a P-MOSFET under varied pulse conditions.

Next, the plasma nitridation process was applied to an oxide film constituting a gate insulation film of a P-MOSFET by using the aforesaid plasma processing apparatus 1 under varied plasma conditions, and the result of studies on the PMOS having a resultant oxynitride film formed thereon are shown in FIG. 8 in which an ON current characteristic is taken on the horizontal axis and NBTI resistance is taken on the vertical axis. Plasma nitridation conditions of this case are as follows.

A thickness of a base oxide film is 1.0 nm, a pressure inside the process vessel is 50 mTorr (6.65 Pa), and power is 1500 W. Further, as for a gas for the plasma nitridation process, a flow rate ratio of an argon gas/a nitrogen gas is 1000 sccm/40 sccm. The time of the plasma nitridation process is 5, 10, 20, and 40 seconds, and nitrogen concentration in a gate oxide film in these cases is 5 at %, 9 at %, 11 at %, and 15 at % respectively.

In FIG. 8, pulse conditions are as follows:
a pulse condition 1: ON time/OFF time is 50 μsec/50 μsec (ON duty 50%, a repetition cycle 10 kHz);
a pulse condition 2: ON time/OFF time is 50 μsec/10 μsec (ON duty 83%, a repetition cycle 17 kHz);

a pulse condition 3: ON time/OFF time is 10 μsec/10 μsec (ON duty 50%, a repetition cycle 50 kHz); and a pulse condition 4: ON time/OFF time is 200 μsec/500 μsec (ON duty 29%, a repetition cycle 1 kHz).

Incidentally, CW represents the result in a case of a continuous wave.

As is seen, it has been confirmed that the result under the pulse condition 4 is the same as the result in the case of the continuous wave, but as the condition is changed from the pulse condition 3 to the pulse condition 1, the ON current characteristic and the NBTI resistance of the PMOS both are improved. That is, in the case of the conventional continuous wave, the ON current characteristic and the NBTI resistance are in a trade-off relation, and improvement in one of them by changing nitrogen concentration in the film results in deterioration in the other, but it has been confirmed that by changing the ON time/OFF time (the duty ratio and the repetition cycle) as in the present examples, it is possible to improve both the ON current characteristic and the NBTI resistance. That is, when the nitrogen concentration in the film is 5 at %, more improvement is observed in the NBTI resistance, and when the nitrogen concentration is 9 at %, substantially the same tendency is observed. When the nitrogen concentration is 11 at %, the NBTI resistance and the ON current characteristic can be both improved to substantially the same degree, and when the nitrogen concentration is 15 at %, more improvement is observed in the ON current characteristic. The nitrogen concentration is not limited to this range, and a preferable range thereof is 1 at % to 20 at %, more preferably 5 at % to 15 at %, still more preferably 9 at % to 13 at %. In either case, it is possible to improve both the ON current characteristic and the NBTI resistance to a higher degree than in the conventional art.

An example of steps of the plasma nitridation process using the plasma processing apparatus 1 will be further described.

First, a wafer W having an oxide film formed on a surface thereof is carried into the process vessel 2, and the wafer W is placed on the susceptor. Then, while an Ar gas is supplied into the process vessel 2 at a flow rate of, for example, 2000 sccm, an atmosphere in the process vessel 2 is exhausted by the exhaust apparatus 11, so that the pressure inside the process vessel 2 is kept at a reduced-pressure of 126.66 Pa. At this time, the wafer W is heated by the heater 4a to, for example 400° C. Thus sufficiently heating the wafer W in advance and reducing the pressure inside the process vessel 2 enable effective removal of moisture adhering to the wafer W, and thus exhausting the atmosphere in the process vessel 2 along with the supply of the Ar gas enables effective purge of the moisture removed from the wafer W and a residual atmosphere in the process vessel 2. Consequently, it is possible to uniformly and effectively introduce N atoms to the substrate at the time of the plasma nitridation process. A so-called pre-heat step as described above is continued for about 70 seconds, for instance.

Next, a plasma ignition step follows. At this time, the Ar gas is kept supplied into the process vessel 2 at a flow rate of, for example, 2000 sccm, and the pressure inside the process vessel 2 is kept at a reduced pressure of 126.66 Pa. Thus setting the pressure inside the process vessel 2 higher than the proper pressure for the plasma nitridation process facilitates, so to speak, plasma ignition. At the plasma ignition time, an output of the microwave supplier 36 is 2000 W and such a plasma ignition step is continued for 5 seconds, for instance.

Next, at the time of the plasma nitridation process, the pressure inside the process vessel 2 is further reduced to 6.7 Pa. At this time, the supply flow rate of the Ar gas is decreased to 1000 sccm and the output of the microwave supplier 36 is also decreased to 1500 W, whereby the pressure inside the process vessel 2 and the output of the microwave supplier 36 are both set to the pressure and the output for the plasma nitridation process. Such a preparatory and adjustment step is continued for 5 seconds, for instance, so that the pressure and the gas flow rate are stabilized, thereby stabilizing the plasma.

Next, while the 6.7 Pa pressure inside the process vessel 2, the 1500 W output of the microwave supplier 36, the 1000 sccm supply flow rate of the Ar gas are maintained, a nitrogen gas is supplied into the process vessel 2 at a flow rate of, for example, 40 sccm, whereby the plasma nitridation process is applied to the oxide film of the wafer W. The time of the plasma nitridation process is, for example, 5 seconds to 40 seconds.

When a predetermined plasma nitridation process is finished, the microwave supplier 36 is stopped to extinguish the plasma (so-called plasma OFF). At this time, the 40 sccm supply flow rate of the nitrogen gas and the 1000 sccm supply flow rate of the Ar gas are maintained, and the 6.7 Pa pressure inside the process vessel is also maintained. Such a plasma extinguish step is continued for three seconds, for instance.

Next, the supply of the nitrogen gas and the Ar gas is stopped, the pressure inside the process vessel 2 is raised up to the same pressure as that in a preliminary chamber such as, for example, a load lock chamber connected to the plasma processing apparatus 1, and thereafter the wafer W is carried out of the process vessel 2.

Performing the plasma nitridation process through the steps described above makes it possible to uniformly introduce nitrogen to a surface side of the oxide film with only low plasma damage being caused, resulting in improvement in the NBTI resistance and the ON current characteristic.

Figure 9:
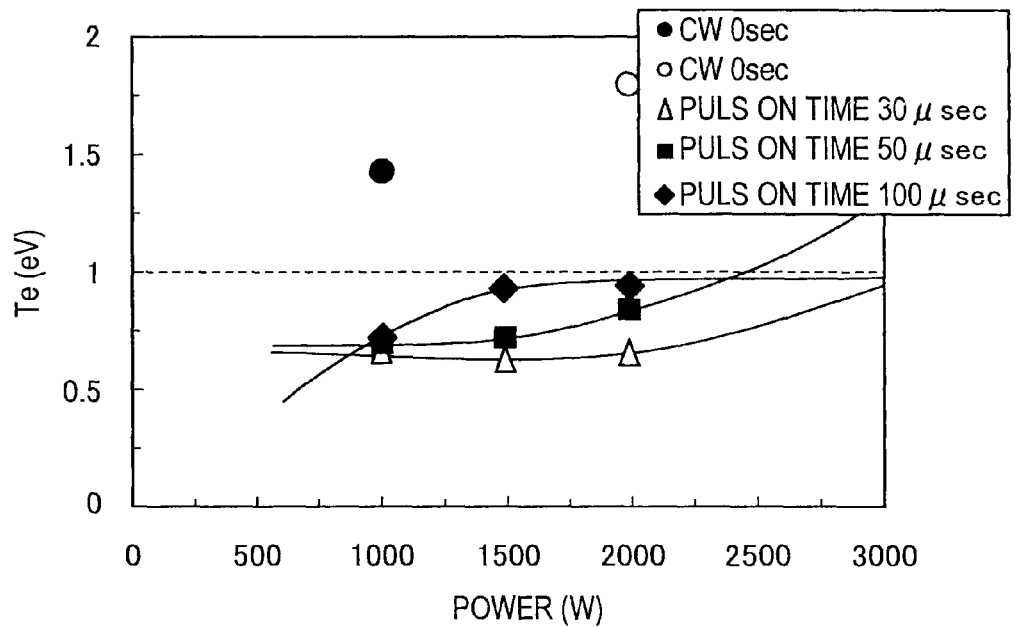
FIG. 9 is a graph showing changes in electron temperature in accordance with a change in power of a microwave.
Figure 10:
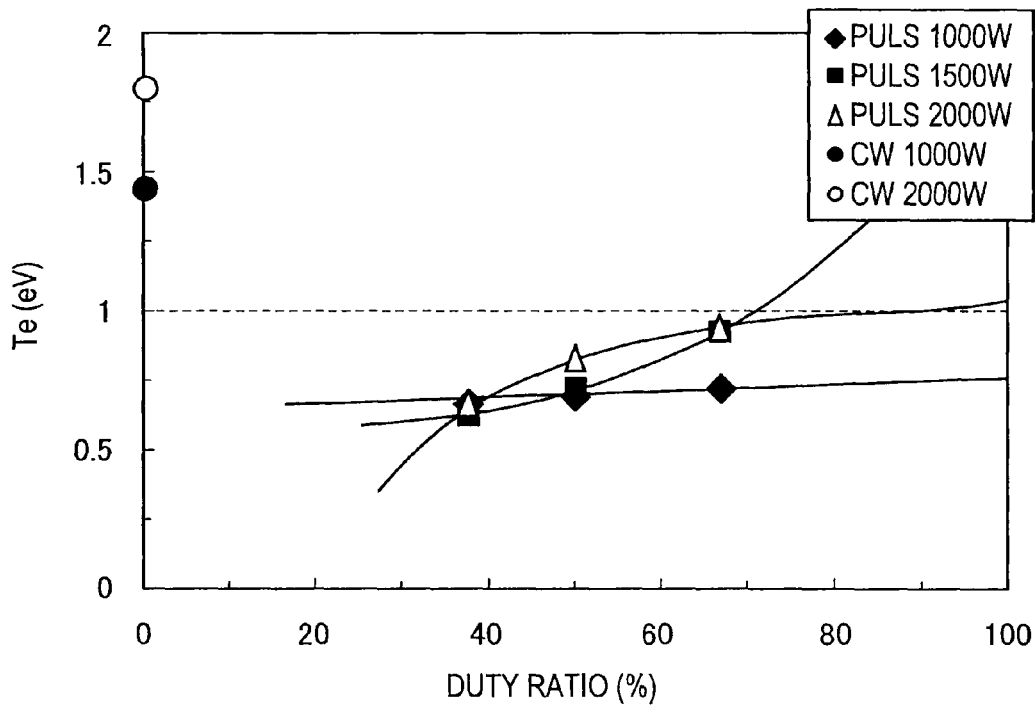
FIG. 10 is a graph showing changes of electron temperature in accordance with a change in ON duty ratio of a pulsed microwave.

Next, by using the plasma processing apparatus 81 shown in FIG. 6, the plasma nitridation process was applied to an oxide film constituting a gate insulation film of a P-MOSFET under varied plasma conditions of various kinds, and the results of studies on how electron temperature changed at this time are shown FIG. 9 and FIG. 10. The plasma nitridation conditions are as follows: thickness of a base oxide film is 1.0 nm; pressure in the process vessel is 50 mTorr (6.65 Pa); and as for gas supply amounts at the time of the plasma nitridation process, a flow rate ratio of an argon gas/a nitrogen gas is 1000 sccm/40 sccm.

FIG. 9 shows changes in electron temperature in accordance with a change in power. As for the pulse conditions, the OFF time was set to 50 μsec and the ON time was set to 30 μsec, 50 μsec, and 100 μsec, and the changes in electron temperature in the respective cases were studied. Incidentally, in the drawing, CW represents the result in a case of a continuous wave.

As is seen from the results, it is possible to control the plasma electron temperature to 1 eV or lower which does not cause any damage to a substrate, by controlling the power (output) to 1000 W to 3000 W when the ON time is 30 μsec and when the ON time is 100 μsec, and by controlling the power to 1000 W to 2300 W when the ON time is 50 μsec. Therefore, in order to realize low electron temperature to reduce damage in the plasma nitridation process by the intermittent supply of a microwave, the power is preferably 1000 W to 3000 W, more preferably 1000 W to 2300 W, and still more preferably 1000 W to 2000 W, and thus high power can be used for the nitridation process. That is, supplying the power in a pulse form makes it possible to lower the plasma electron temperature, even if the power is high.

FIG. 10 shows changes in electron temperature in accordance with a change in ON duty ratio when a microwave is supplied in a pulse form. The power was set to 1000 W, 1500

W, and 2000 W, and changes in electron temperature in the respective cases were studied. Incidentally, in the drawing, CW represents the result in a case of a continuous wave.

As is seen, when the ON duty ratio is 40%, the electron temperature is about 0.7 eV. When the ON duty ratio is 50%, the electron temperature exceeds 0.7 eV. When the ON duty ratio is further higher, the electron temperature tends to gradually increase in all the cases where the power is set to the above values. In the case of the 1000 W power, it is possible to control the electron temperature to 1 eV or lower if the ON duty ratio is lower than 100%. Further, it has been found that in the case of the 1500 W power, it is possible to control the electron temperature to 1 eV or lower if the ON duty ratio is not higher than 70%, and in the case of the 2000 W power, it is possible to control the electron temperature to 1 eV or lower if the ON duty ratio is not higher than 99%.

Even in a case of high power exceeding 500 W, the electron temperature can be lowered to 1 eV or lower, which enables a damage-free process. The power is preferably higher than 500 W and not higher than 5000 W, and more preferably 1000 W to 2300 W. Therefore, the ON duty ratio of the pulsed microwave supply is preferably 10% to 90%, more preferably 10% to 65%.

The inventors also studied the pulse ON time, and it has been found from the result that by setting the pulse ON time to 5 µsec or more, preferably 30 µsec to 100 µsec, it is possible to control the electron temperature to more than 0.7 eV to 1 eV or lower in all the cases where the power is 1000 W, 1500 W, and 2000 W.

In the plasma processing described above, the microwave plasma using a plane antenna is used as a plasma source, but as other plasma sources, applicable are parallel-plate-type (capacitive-type) plasma, inductively coupled plasma (ICP), ECR plasma, surface wave plasma, magnetron plasma, and the like.

The present invention is capable of reducing thickness of an insulation film of a semiconductor device without increasing a leakage current, and is useful especially in manufacturing a semiconductor device with a high operating speed.

The invention claimed is:

1. A method of plasma nitridation processing in which a nitridation process by plasma is applied to an oxide film comprising:

carrying a substrate having the oxide film into a process vessel, pre-heating the substrate by heating while exhausting an atmosphere in the process vessel along with the supply of Ar gas, igniting Ar gas plasma in the process vessel, and further reducing a pressure inside the process vessel after igniting the plasma along with the supply nitrogen gas into the process vessel, stabilizing the plasma by adjusting the pressure in 1.3 Pa to 133.3 Pa, and then applying plasma nitridation process to the oxide film by the plasma, wherein pressure at igniting the plasma is set higher than pressure for the plasma nitridation processing.

2. The plasma processing method according to claim 1, wherein nitrogen concentration in the oxide film that has undergone the nitridation process is 1 at % to 20 at %.

3. The plasma processing method according to claim 1, wherein the nitridation process by the plasma is performed by the plasma generated by intermittently supplying microwave.

4. The plasma processing method according to claim 3, wherein an ON time of the supply of the microwave in the intermittent supply is 5 µs to 100 µs per cycle.

5. The plasma processing method according to claim 3, wherein a cycle of repetition of the supply and stop of the microwave in the intermittent supply is 5 kHz to 100 kHz.

6. The plasma processing method according to claim 4, wherein an ON duty ratio of the microwave is 9% to 90%.

7. The plasma processing method according to claim 1, wherein the plasma nitridation process is further followed by applying an annealing process to the substrate.

8. The plasma processing method according to claim 7, wherein the annealing process is performed in a mixed gas of $N_2/O_2$ atmosphere.

9. The plasma processing method according to claim 7, wherein the annealing process is performed for one second to thirty seconds.

* * * * *